United States Patent
Popineau et al.

(10) Patent No.: US 9,766,162 B2
(45) Date of Patent: Sep. 19, 2017

(54) METHOD OF DETERMINING MECHANICAL PERFORMANCE OF A STRUCTURE

(75) Inventors: Dominique Popineau, Pau (FR); Paul Wiet, Pau (FR); Julien Fontanabona, Levallois Perret (FR); Michel Bernard, Levallois Perret (FR)

(73) Assignee: TOTAL SA, Courbevoie (FR)

( * ) Notice: Subject to any disclaimer, the term of this patent is extended or adjusted under 35 U.S.C. 154(b) by 809 days.

(21) Appl. No.: 13/985,480

(22) PCT Filed: Feb. 9, 2012

(86) PCT No.: PCT/EP2012/052235
§ 371 (c)(1),
(2), (4) Date: Oct. 17, 2013

(87) PCT Pub. No.: WO2012/110399
PCT Pub. Date: Aug. 23, 2012

(65) Prior Publication Data
US 2014/0032133 A1    Jan. 30, 2014

(30) Foreign Application Priority Data
Feb. 14, 2011    (FR) ...................................... 11 51198

(51) Int. Cl.
*G01M 99/00*    (2011.01)
*G06F 17/50*    (2006.01)

(52) U.S. Cl.
CPC ......... *G01M 99/00* (2013.01); *G06F 17/5018* (2013.01)

(58) Field of Classification Search
None
See application file for complete search history.

(56) References Cited

U.S. PATENT DOCUMENTS 8,589,132 B2 * 11/2013 Miyagi ............... G06F 17/5018
                                                                 700/98
2003/0171879 A1   9/2003 Pittalwala et al.
(Continued)

OTHER PUBLICATIONS

Limam et al., On the collapse of dented tubes under combined bending and internal pressure, Nov. 12, 2011, Internal Journal of Mechanical Sciences, 55, pp. 1-12.*

(Continued)

*Primary Examiner* — An Do
*Assistant Examiner* — Renee I Wilson
(74) *Attorney, Agent, or Firm* — Patterson Thuente Pedersen, P.A.

(57) ABSTRACT

A method for determining a mechanical performance parameter of a structure in which damage has caused a wall of the structure to change from an initial shape to a damaged shape. The method comprising for geometrically characterizing an external surface of the damaged shape; modeling a test body comprising a surface substantially identical to the external surface of the damaged shape; modeling a test wall having a portion of a shape substantially identical to the initial shape; calculating a deformed test wall and a stress state related to the deformation, the deformation of the test wall being caused by a relative displacement of the test body and the test wall, the relative displacement being configured to give the deformed test wall an external surface substantially identical to the external surface of the damaged shape; and evaluating mechanical performance of the deformed test wall.

11 Claims, 8 Drawing Sheets

(56) References Cited

U.S. PATENT DOCUMENTS

2009/0103984 A1     4/2009   Zarisfi
2010/0005845 A1*   1/2010   Yoshida .............. G06F 17/5018
                                                   72/31.01

OTHER PUBLICATIONS

Li S et al: "Modelling transverse cracking damage in thin, filament-wound tubes subjected to lateral indentation followed by internal pressure", International Journal of Mechanical Sciences, Pergamon Press, Oxford, GB, vol. 47, No. 4-5, Apr. 1, 2005 (Apr. 1, 2005), pp. 621-646, XP00494405, ISSN: 0020-7403, DOI: 10.1016/J.IJMECSCI.2004.12.015.
Corona E et al: "Yield anisotropy effects on buckling of circular tubes under bending", International Journal of Solids and Structures, Mew York, NY, US, vol. 43, No. 22-23, Nov. 1, 2006 (Nov. 1, 2006), pp. 7099-7118, XP025241879, ISSN: 0020-7683, DOI: 10.1016/J.IJSOLSTR.2006.03.005 [retrieved on Nov. 1, 2006].

* cited by examiner

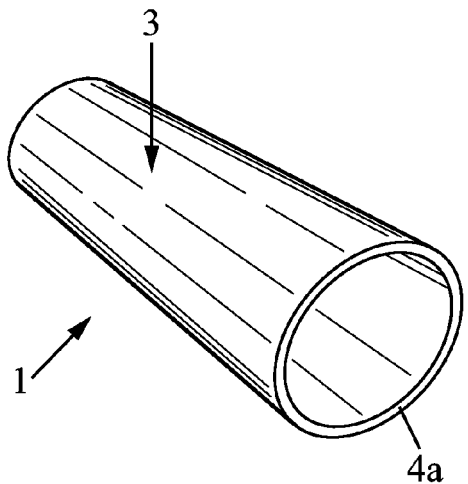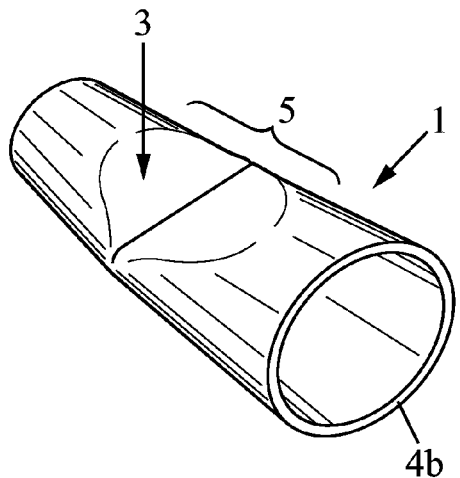
FIG. 1a   FIG. 1b
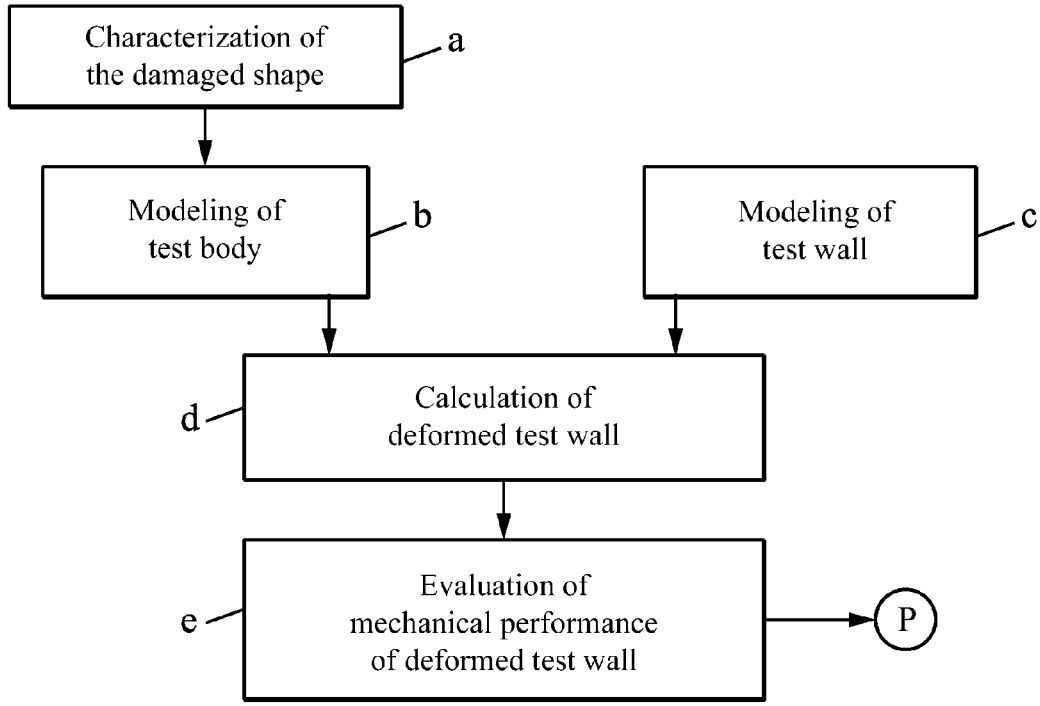
FIG. 2

METHOD OF DETERMINING MECHANICAL PERFORMANCE OF A STRUCTURE

PRIORITY CLAIM

The present application is a National Phase entry of PCT Application No. PCT/EP2012/052235, filed Feb. 9, 2012, which claims priority from FR Application No. 11 51198 filed Feb. 14, 2011, said applications being hereby incorporated by reference herein in their entirety.

TECHNICAL FIELD

The invention relates to a method of determining the mechanical performance of a structure. It particularly relates to structures intended to contain a fluid, such as a tank or buffer capacity, or a portion of a pipeline.

BACKGROUND OF THE INVENTION

During their operational period, large structures are susceptible to mechanical damage of various origins, such as faulty maneuvers by heavy-construction machines, falling loads such as freight containers, boat anchor activity, or malicious acts. When the damage is a dent, the damaged structure often remains fluidtight, but the question arises as to its mechanical properties and whether it can continue to be used. For example, the internal pressure at which a pipeline can still be used and its shape determine the flow rate of the hydrocarbons which can pass through it.

No method currently exists for determining the mechanical performance of a structure, particularly one of large dimensions, without placing the structure out of service or performing a destructive test such as burst testing. Standards are used (ASME, API, ERG, PDAM . . . ) which relate a parameter defining an aspect of the defect, generally the dent size relative to the diameter, to whether the structure can continue to be used. The defect sizes acceptable by these standards are low. The damaged structure must therefore be put out of service and replaced. For example, for an unconstrained dent in a pipeline, i.e. where the cause of the dent is no longer present, the maximum limit allowed by the PDAM standard is a dent depth of 7% of the diameter.

An object of the invention is to remedy some or all of the above disadvantages by providing a method of determining mechanical performance of a structure that has been damaged, which can be applied in situ, without destructive testing, and which yields a reliable result.

SUMMARY OF THE INVENTION

The invention proposes a method of determining a mechanical performance parameter of a structure comprising a wall, wherein damage to the structure has caused the wall to change from an initial shape to a damaged shape, the damaged shape being different from the initial shape in a given area. The method comprises the steps of:
a) making measurements for geometrically characterizing an external surface of the damaged shape in the given area;
b) modeling a test body based on the measurements made, wherein the test body has a surface substantially identical to the external surface of the damaged shape in the given area and the test body is capable of matching the external surface of the damaged shape characterized in step a);
c) modeling a test wall having a portion of a shape substantially identical to the initial shape;
d) calculating a deformed test wall and a stress state related to the deformation, the deformation of the test wall being caused by a relative displacement of the test body and the test wall, the relative displacement being configured to give the deformed test wall an external surface substantially identical to the external surface of the damaged shape characterized in step a); and
e) evaluating mechanical performance of the deformed test wall obtained in step d).

The structure may be of any type. It may be intended to contain a fluid (tank, buffer capacity, etc.), or it may be used to transport a fluid (pipeline, etc.). It may be the hull of a ship. If it is an assembly of large dimensions, the structure is then the portion of this assembly concerned by the damage, for example a section of pipeline or a portion of a ship hull.

The type of mechanical performance depends on the nature of the structure. The desired parameter must provide information on the resistance of the structure to a given mechanical stress. For a tank or pipeline, this may be the burst pressure or the pressure at which a loss of stiffness occurs.

In step a), an external surface of the structure is geometrically characterized in its damaged shape. In particular, the damage may be in the form of a dent. Generally the cause of the damage has disappeared. The wall of the structure is deformed but there is no hole, although material may have been torn off. Internal or external corrosion may also have occurred, which can affect the thickness and the mechanical properties of the material or materials constituting the wall. Geometric characterization is understood to mean any means of representing at least the shape of the external surface of the structure at the location of the damage.

This characterization allows at least defining the location, within the point space, of the external surface of the damaged shape. The characterization may be more or less precise. The method to be used may vary, depending on where the structure is located, whether or not it is submerged, and the characterization means available. If possible, a reliable impression of the external surface of the deformed wall is obtained.

In step b), a test body is modeled, referred to as the "impactor". This involves creating a mathematical representation of a solid for calculation purposes. This solid has a surface similar, and preferably substantially identical, to the surface characterized in step a). It can match the external surface of the damaged shape, meaning the solid has a shape complementary to the damaged shape as characterized. The test body therefore comprises a "positive" impression of the defect, with the damaged structure having "negative" (indented) damage. The test body therefore resembles an external "cast" of the damaged shape, the accuracy of the cast to the original depending on the precision of the characterization method used in step a).

In step c), a test wall is modeled. It mathematically represents the wall of the structure in its initial undamaged shape, known from plans, photos, surface equations, or any other known means. More specifically, it comprises at least one portion substantially identical to the initial shape.

Whether or not a surface is "substantially identical" to another surface can be evaluated by an appropriate standard, for example by averaging deviations between regularly spaced points on the surface and projecting these same points onto the other surface. A surface will be considered "substantially identical" to another one if the difference between the two has been determined to be less than a predetermined threshold, or more simply if measurements or the naked eye indicate that they are very close to each other.

In step d), a calculation for obtaining a deformed test wall is performed. To do this, a relative displacement of the test body, or "impactor", is simulated, towards the test wall (not yet deformed and which is the "impactee"). The interaction of the two bodies is governed in particular by a mechanical model comprising mathematical rules establishing a relation between deformations and stress state of the test wall. The goal of the relative movement is to impress into the test wall a deformation which is, after the test body is withdrawn, substantially identical to the actual deformation which was characterized.

If the shape obtained for the test wall is not satisfactory, i.e. not sufficiently close to the external surface as characterized, the calculation in step d) can be reiterated while modifying:
- the parameters of the relative displacement of the test body and the test wall; and/or
- the shape or dimensions of the test body; and/or
- changing the mechanical laws governing the behavior of the test body.

In step e), evaluation of mechanical performance performed based on the deformed test wall. For example, it may be subjected to increasing internal pressure with detection of a loss of stiffness or bursting.

The calculation step d) provides at least two very interesting results:
- a stress state of the deformed test wall, which has been experimentally verified to have very good representativeness. It has in fact been tested that, if a structure is purposefully damaged and then a method of the invention applied (characterizing the defect, then modeling and calculations), mechanical performance values are obtained that are very close to those measured experimentally for this damaged structure. This will be illustrated below in the figures and in a comparison of experimental results to those obtained by a method of the invention; and
- information concerning the stress state and deformation state of the deformed test wall is no longer considered statically but as the result of a dynamic process (the progressive deformation bringing a mechanical model into play). It is thus possible to detect the extension of certain phenomena due to plasticity and which are not necessarily detectable on the damaged structure itself by ordinary means.

It will be noted that the method, experimentally validated in this manner, yields a mechanical performance parameter after an impression of the damage has been obtained. The structure remains available to perform its function and is not destroyed or altered by burst testing or fatigue testing.

The method of the invention also allows taking into account operational changes to and/or constraints on the structure during and after its damage, for example the presence of supports. To do this, the calculations in steps d) and e) are performed while applying these constraints to the modeled test wall.

In certain embodiments, the invention may make use of one or more of the following characteristics:
- The mechanical performance evaluation of step e) comprises calculating deformation of the deformed test wall obtained in step d) under the effect of increasingly intense mechanical stress, wherein the mechanical performance parameter is an intensity at which a rupture or loss of stiffness of the deformed test wall is detected. In this case, the mechanical performance calculation aims to reproduce an actual rupture test. It is chosen as a function of the nature of the structure and the desired mechanical performance parameter.
- The increasingly intense mechanical stress comprises applying increasing internal pressure on the deformed test wall, wherein the test wall modeled in step c) may be supplemented with missing portions in order to close it off, and wherein the mechanical performance parameter is a pressure at which bursting of the deformed test wall due to the applied internal pressure is detected. In this case, the simulated rupture test is a burst test. The bursting is detected in particular by a strong increase in distances in the test wall and a relaxation of the stresses to which it is subjected.
- Calculating deformation of the test wall in step d) and evaluating mechanical performance of the deformed test wall in step e) comprise a finite element method, and wherein modeling the test body and the test wall in steps b) and c) comprises a discretization into finite elements. Testing has shown that the finite element method yields good results. Other methods could be used, such as an explicit finite difference method.
- Calculating deformation of the test wall in step d) and evaluating mechanical performance of the deformed test wall in step e) use an elasto-plastic deformation model of the test wall. The elasto-plastic laws are quite good at taking into account phenomena related to damage, and yield a stress state for the deformed test wall that is of verified representativity.
- For calculating deformation of the test wall in step d), the surface of the test body substantially identical to the external surface of the damaged shape is non-deformable. Although a deformable test body, with its own mechanical model and which may or may not be identical to the test wall, may offer advantages, it has been observed that the results obtained in step d) are representative even when the test body is treated as being non-deformable. This simplifies the calculations.
- For calculating deformation of the test wall in step d), the relative displacement of the test body and the test wall comprises a decrease and then an increase in the distance between the test body and the test wall, to take into account a phenomenon of elastic rebound of the test wall. The elastic rebound phenomenon corresponds to the fact that the test wall first undergoes significant denting due to the action of the test body, but this deformation is then attenuated by the elastic rebound. To take this phenomenon into account, the test wall is first impressed with a deformation greater than the one ultimately targeted by decreasing the distance between the test wall and test body, then allowing the rebound to occur by increasing the distance between the two bodies.
- For calculating deformation of the test wall in step d), the relative displacement of the test body and the test wall occurs in a direction which intercepts the test wall in the given area at an incidence substantially orthogonal to an external surface of the initial shape. An orthogonal incidence is not the only one possible, but it is often suitable for obtaining the desired shape for the test wall. In certain cases, an oblique incidence may be of interest, for example when it is evident that the damage results from an impact having an oblique incidence.
- The measurements made in step a) further comprise measurements of the thickness (e) of the damaged shape at several locations in the given area, the thickness measurements being used to correct the thickness of the deformed test wall obtained by the calculation of step d), such that the deformed test wall has a thickness substantially identical to the thickness of the damaged shape in said several locations. It is of interest to incorporate changes in the wall thickness in addition to the wall shape, whether they result from damage or some other cause such as corrosion. This can be done by characterizing the thickness (measured at several points on the surface of the wall) and correcting the thickness of the test wall. The correction can be done after the deformation calculation. It can also be done before.

The measurements made in step a) for geometrically characterizing the damaged shape comprise one or more types of measurements from among the group consisting of: laser beam triangulation, manual readings, photogrammetry, and ultrasound probing. These measurements provide a more or less precise characterization of the external surface at the location of the damage (manual readings, photogrammetry, laser triangulation, ultrasound), and others also provide measurements of the wall thickness (ultrasound).

The invention also relates to a computer program product comprising one or more sequences of instructions accessible to a processor and which, when they are executed by the processor, cause it to carry out steps b) to e) of a method as described above, the processor having received data comprising measurement results for geometrically characterizing the damaged shape in the given area.

The program carries out steps b) to e) of the method as described above. In order to function, the processor needs to process data corresponding to the information collected in step a). In addition, if it does not already have them, the program can be provided with the data it needs corresponding to the initial shape of the wall, the mechanical models, the relative movement of the test body and the test wall, and/or the desired mechanical performance evaluation. These data can be introduced at the request of the processor, which queries the user. The user can be offered predetermined choices of structures to be tested and models, as well as options corresponding to the variants of the method.

The invention also relates to a computer-readable storage medium, comprising one or more sequences of instructions of the above-described computer program product.

BRIEF DESCRIPTION OF THE DRAWINGS

Other features and advantages of the invention will be apparent from the following description of some non-limiting examples, with reference to the attached drawings in which:

FIG. 1a represents an example of a structure, which in this case is a section of pipeline for conveying hydrocarbons under pressure;

FIG. 1b represents the same structure, but with a damaged wall;

FIG. 2 shows a diagram representing a method of the invention;

FIG. 3b illustrates the modeling of a test body (step b) from the characterization represented in FIG. 3a;

DESCRIPTION OF EMBODIMENTS

Figure 3A:
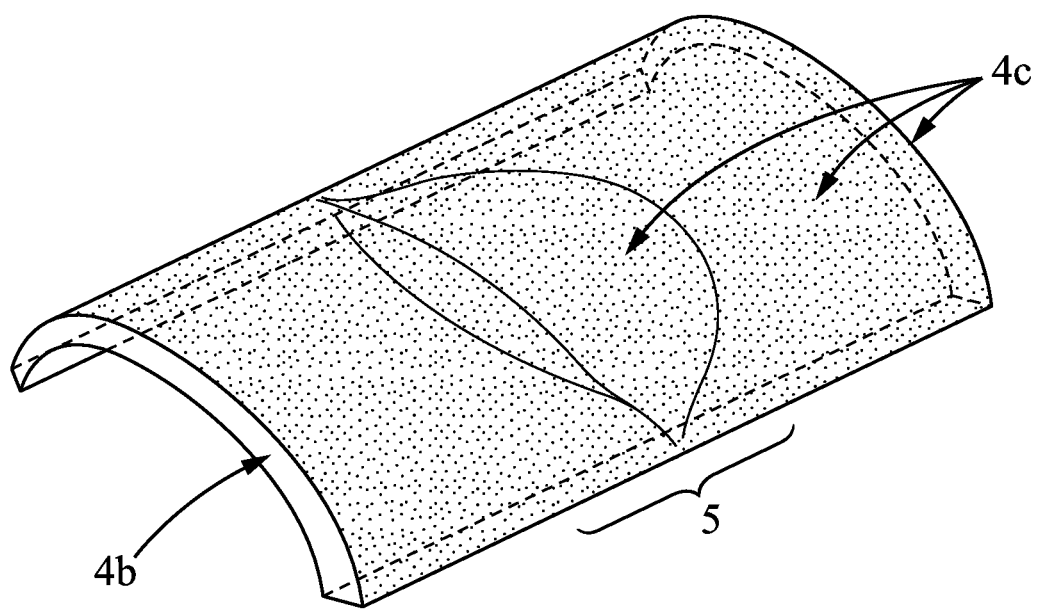
FIG. 3a represents a characterization of the external surface of the damaged shape (step a)

For clarity, the dimensions of the various elements represented in these figures are not necessarily in proportion to their actual dimensions. Identical references in the figures correspond to identical elements.

FIG. 1a shows a structure 1 which is a section of pipeline. It comprises a wall 3 of a substantially cylindrical initial shape 4a and of a given uniform thickness.

FIG. 1b illustrates the same structure, damaged in a given area 5 of the wall. The wall is now in a damaged shape 4b, and has a dent in the given area. This dent could be due to a falling pylon, its upper portion having fallen against the pipeline and then coming to rest more or less horizontally and substantially orthogonal to the longitudinal direction of the pipeline.

For the experimental tests concerned below, such a section of pipeline was reproduced in a form represented in the lower part of FIG. 3c, in which the two circular openings of the section were capped off, particularly so that a burst test could be conducted.

The main steps of a method of the invention are represented in the diagram in FIG. 2. In step a), the damaged shape is characterized geometrically. In step b), a test body is modeled from the results of the measurements performed in step a). In step c), a test wall is modeled. The modeling in steps b) and c) is used in step d) to calculate a deformed test wall. Then the mechanical performance of the deformed test wall is evaluated (step e), for example by subjecting the deformed test wall to increasing internal hydrostatic pressure. A mechanical performance parameter P is obtained, which is therefore the burst pressure of the structure. In certain cases, there is no bursting, but only a loss of stiffness expressed as a significant and sudden deformation.

Aside from the models of the test body and the test wall, step d) makes use of a mechanical model of the test wall and a mechanical model of the test body. These models are from know mathematical laws, for example the laws of elasto-plastic deformation for the steel constituting the wall. For the test body, the model can be very simple if considered to be non-deformable. The calculation in step d) simulates a relative displacement of the test body and the test wall in a manner that causes a deformation of the test wall. This relative movement is configured by a known method. It involves defining the position of the two bodies in space. The goal of the relative displacement is to have, at the end of the calculation, a deformation in the test wall that is substantially identical to the one characterized in step a).

FIG. 3a illustrates the geometric characterization of the external surface 4c of the wall of the structure in its damaged shape 4b. The spatial coordinates of a plurality of points on the external surface are obtained using a laser triangulation method which is known. The file containing these coordinates allows mathematically representing the external surface. The external surface could also be represented by mathematical surfaces or by any other equivalent method. It is understood that the characterization provides at least the general shape of the external surface where the damage is located.

Figure 3B:
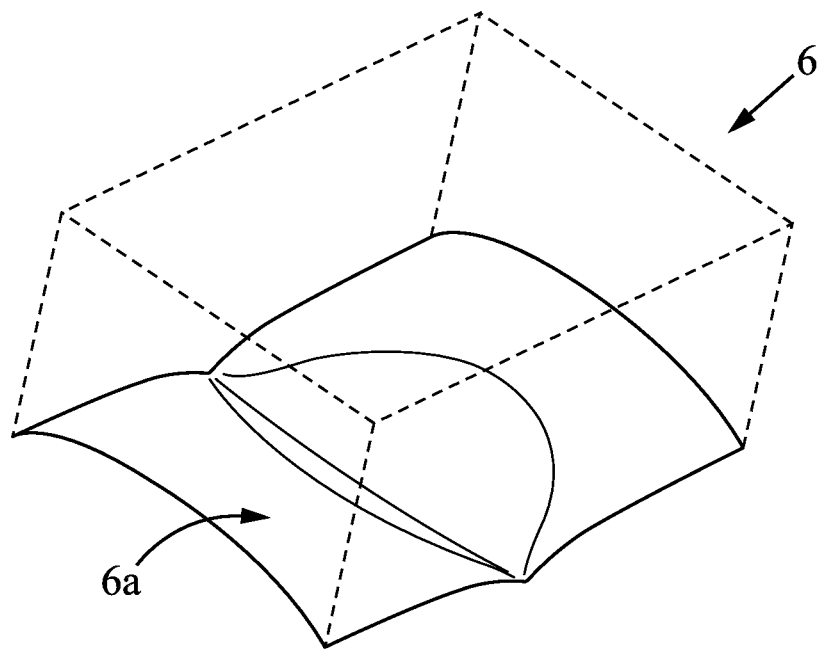

FIG. 3b illustrates a test body 6 obtained from the characterization represented in FIG. 3a. The test body can be represented as a solid comprising a surface 6a substantially identical to the external surface characterized in step a). The data collected in step a) serve to define this surface of the test body. This is then supplemented, for example in the form represented by thin dotted lines, to achieve a volume and a general shape complementary to that of the damage. The test body is a sort of external "cast" of the damage. Its surface 6a is a positive mold of the shape of the damage, which is a negative indentation in the damaged shape of the structure wall. The quality of the "cast" depends on the precision of the characterization performed in step a).

One will understand that the test body can be supplemented in numerous ways starting from the surface 6a. In actuality, the test body is defined by this surface and an orientation of this surface which determines the side of the surface which is to be applied against the test wall during the calculation in step d).

Figure 3C:
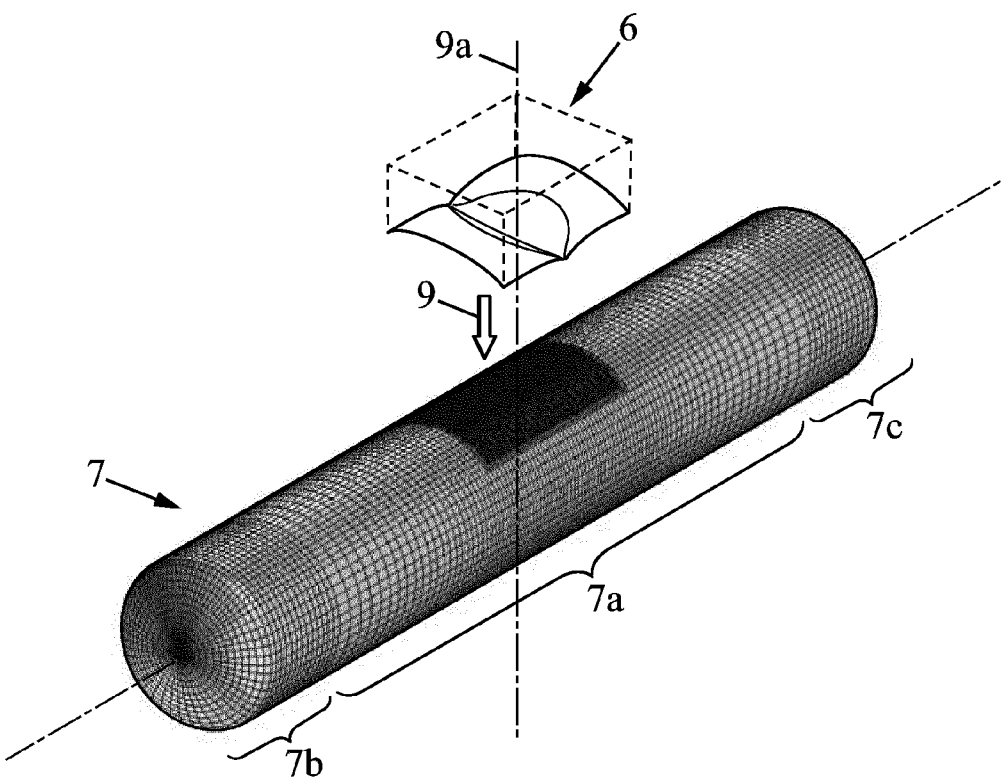
FIG. 3c shows the modeling of a test wall (step c)
Figure 3D:
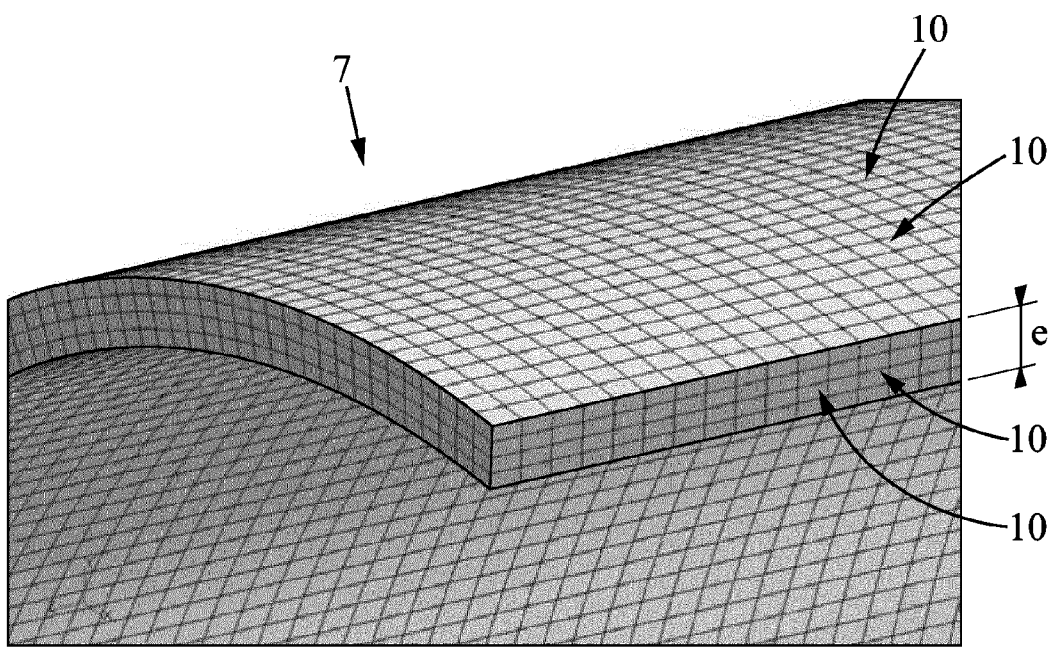
FIG. 3d represents a closer view of a portion of the test wall of FIG. 3c.

FIG. 3c represents the test body 6 in relative motion 9 with respect to the test wall test 7. The motion is said to be relative because it does not matter whether the test body is approaching the test wall, or vice versa. The relative motion is occurring in a vertical direction 9a passing through the longitudinal axis of the test wall. The test wall comprises a portion 7a which is substantially identical to the initial shape of the section of pipeline represented in FIG. 1a. It has been capped off 7b, 7c to represent the structure which was tested experimentally.

As can be seen in FIG. 3c, as well as in FIGS. 3d, 5a, 5b, 7a and 7b, the test wall is discretized into finite elements 10. The same is true for the test body. This discretization was done from files characterizing the external surface using the Empreinte software developed by Tecnitas in collaboration with the patent applicant. This software produces the files necessary for the deformation calculations in steps d) and e), which were conducted using the software Abaqus.

Note that the method of the invention does not require using such software. The discretization into finite elements and the calculation by the finite element method can be done by other software or programmed directly by a person skilled in the art.

Figure 4:
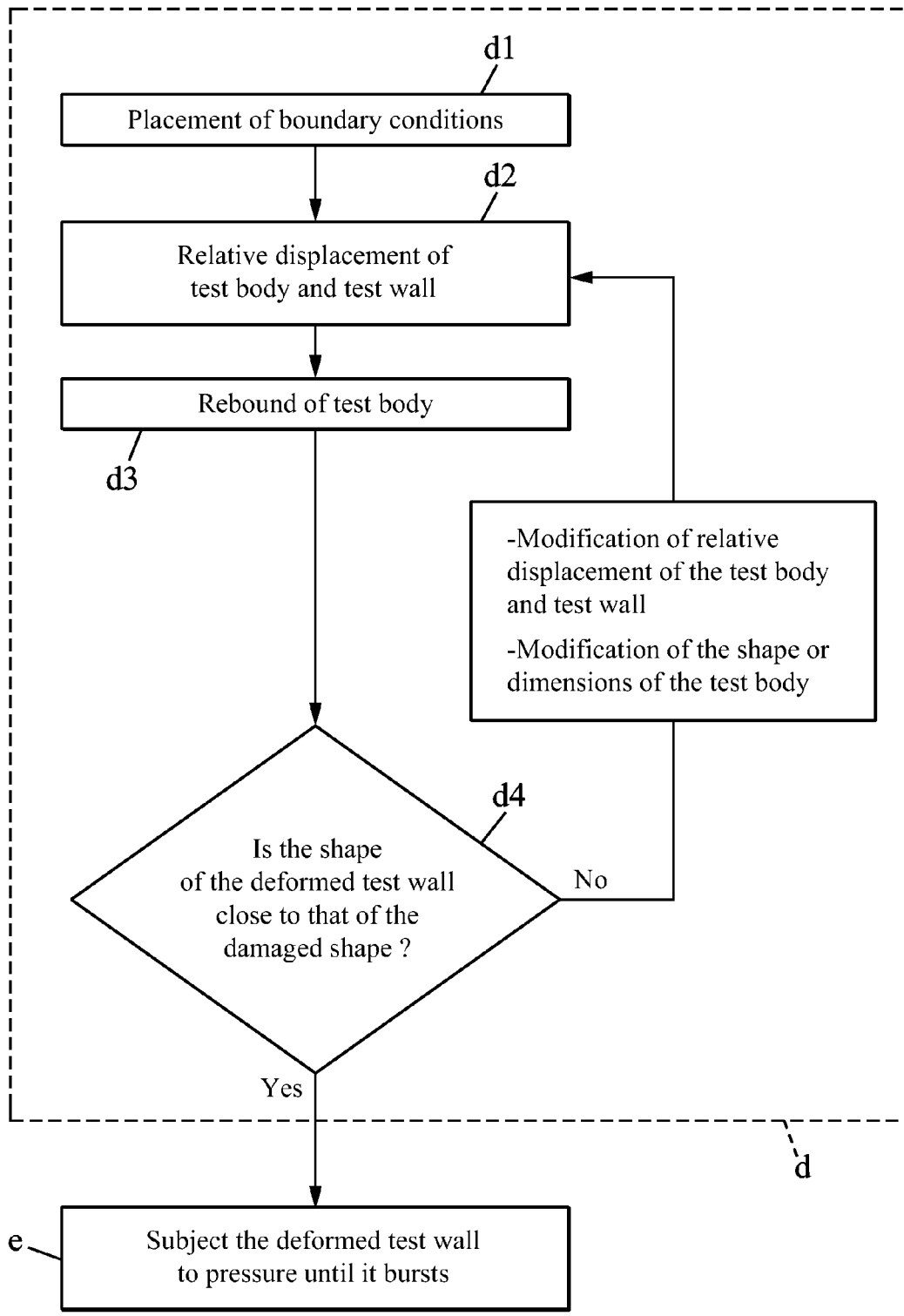
FIG. 4 is a diagram representing steps d) and e), with more details for step d) than in FIG. 2.

FIG. 4 provides more details for step d), in which a deformed test wall is calculated. Step d) comprises placing boundary conditions (sub-step d1). In particular, it is possible to take into account the situation of the structure. For example, one can incorporate the presence of supports, or the fact that the structure was subjected to a given stress field during the damage. The sub-steps d2) and d3) represent two calculation phases, the first simulating a decreasing distance of the test body from the test wall, and the second an increasing distance of the test body, or withdrawal. During the second sub-step, an elastic rebound of the test wall occurs. In other words, at the end of step d2), the test wall is more deformed than it is at the end of step d3). To obtain a specific final indentation (substantially identical to the actual damage), the test body initially indents the test wall further in (step d2).

In sub-step d4), it tests whether the deformed test wall has an external surface substantially identical to the external surface characterized in step a). If this is not the case, steps d2) and d3) are repeated while modifying the parameters of the relative displacement of the test body and test wall, for example the degree of indentation.

The degree of identity to be obtained can be determined by a parametric study which a person skilled in the art is able to conduct without any particular problem.

Figure 5A:
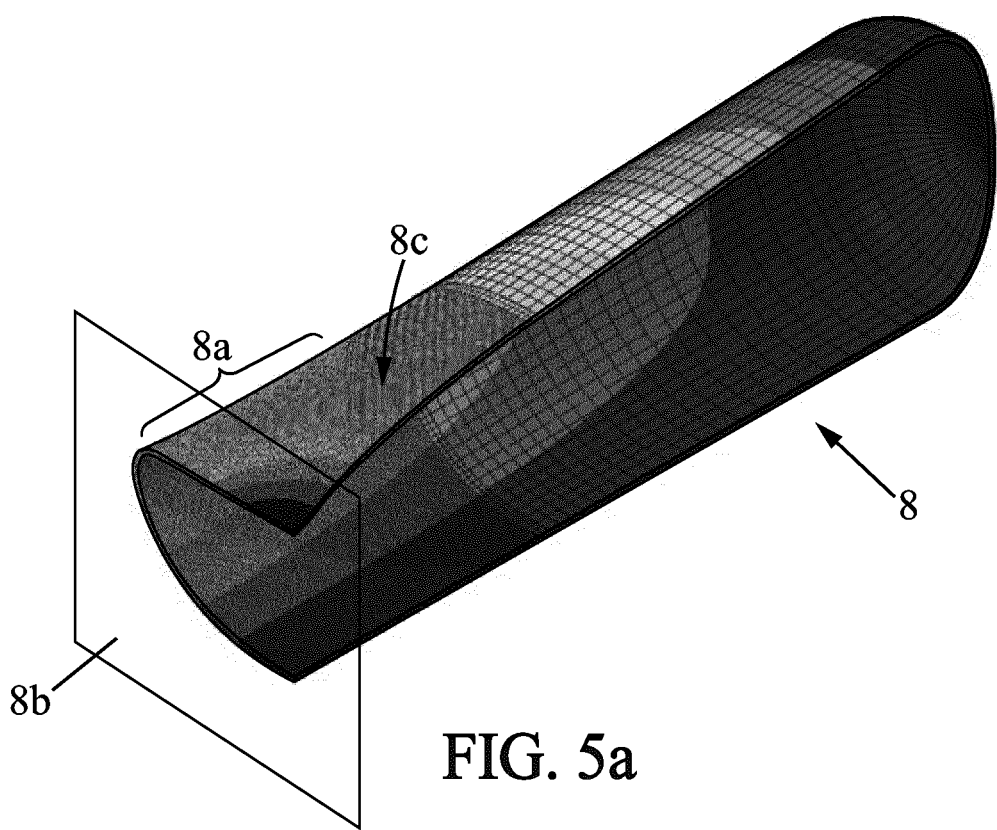
FIG. 5a represents a deformed test wall at the end of step d)

FIG. 5a represents a deformed test wall 8 obtained at the end of step d). It therefore has a shape very similar to the damaged shape of the structure wall. In fact, as the problem is symmetrical in the plane 8b in the example, only a fourth of the deformed test wall is represented. The test wall has a deformation 8a. Its external surface 8c is substantially identical to the external surface 4c characterized in step a).

Figure 5B:
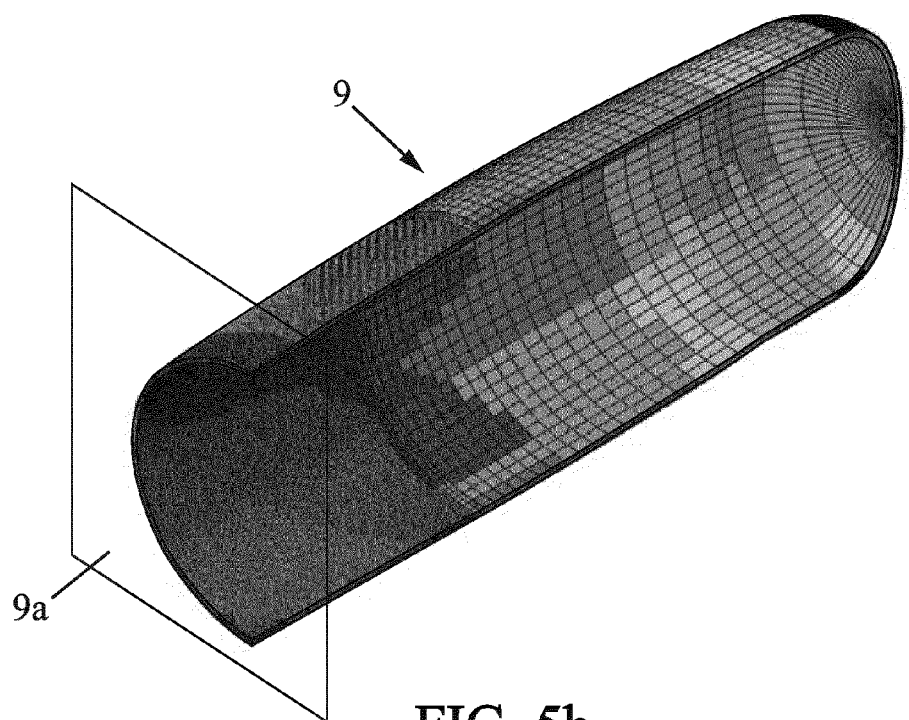
FIG. 5b represents a deformed test wall at the moment it bursts during step e)

FIG. 5b represents the shape 9 of the deformed test wall when it is about to burst. Bursting is detected by a general instability in the calculations, accompanied by stress relaxation and a sudden increase of a characteristic dimension. Only a fourth of the deformed and reinflated test wall is represented, because of the symmetry in the plane 9a (identical to the plane 8b). Note that the shape assumed by the test wall just prior to bursting "resembles" the initial shape. FIG. 5b illustrates a mechanical performance calculation (at bursting). Other calculations are possible, depending on the mechanical performance parameter desired. For example, it is possible to calculate the resistance to an external pressure.

Figure 6:
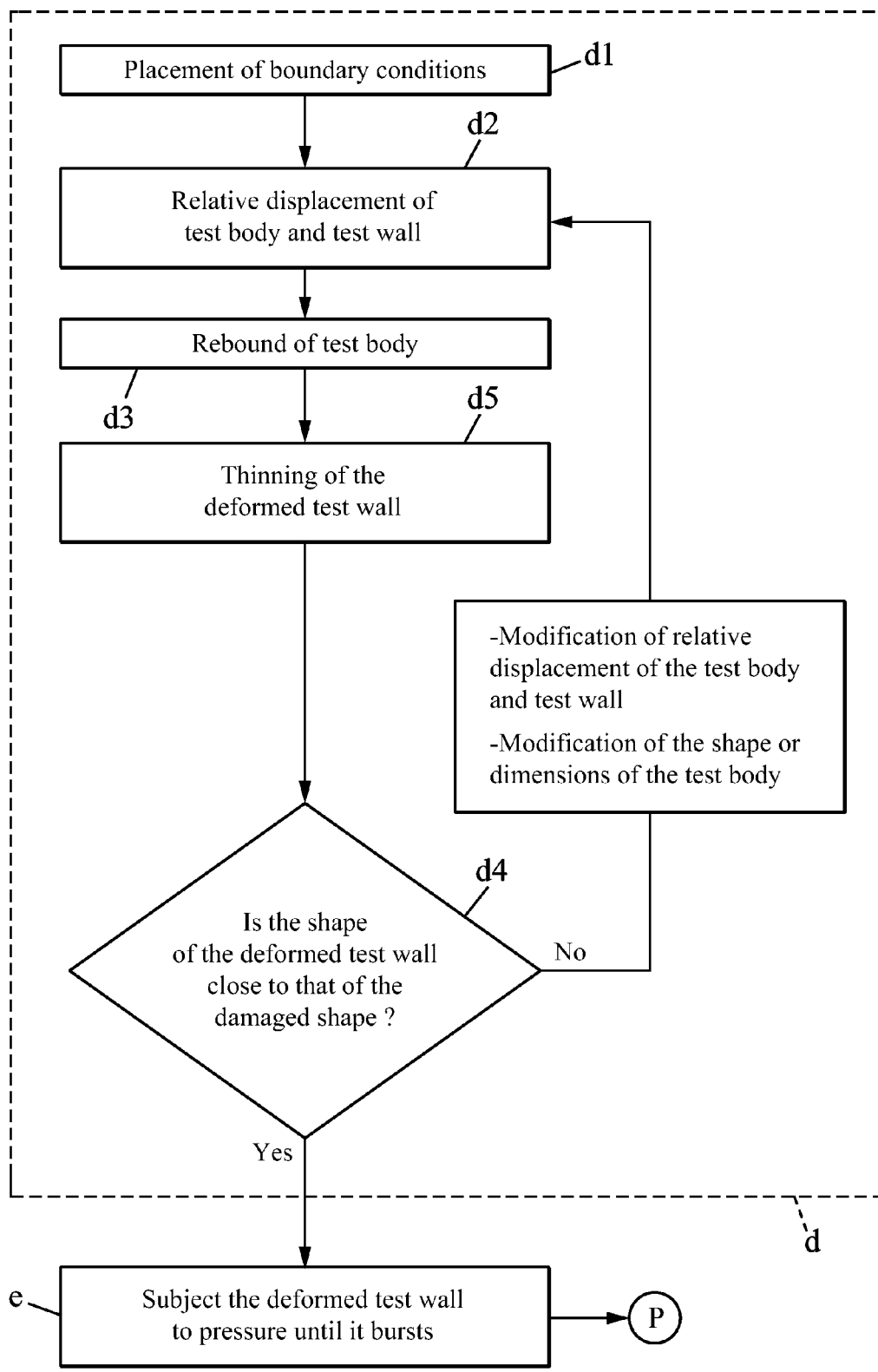
FIG. 6 is a diagram representing a variant of step d), this time taking into account the thickness of the test wall.

FIG. 6 illustrates a variant of the step d) represented in FIG. 4. A sub-step d5) has been added. It comprises thinning (or thickening) the deformed test wall obtained at the end of sub-step d3), to incorporate a characterization of the thickness of the damaged shape 4b of the structure wall. In fact, the thickness e (represented in FIGS. 3d and 7b), if it is modified by the damage or by any other cause, plays an important role in the local resistance of the structure. Alternatively, it is possible to thin the test wall before the deformation calculation.

Figure 7A:
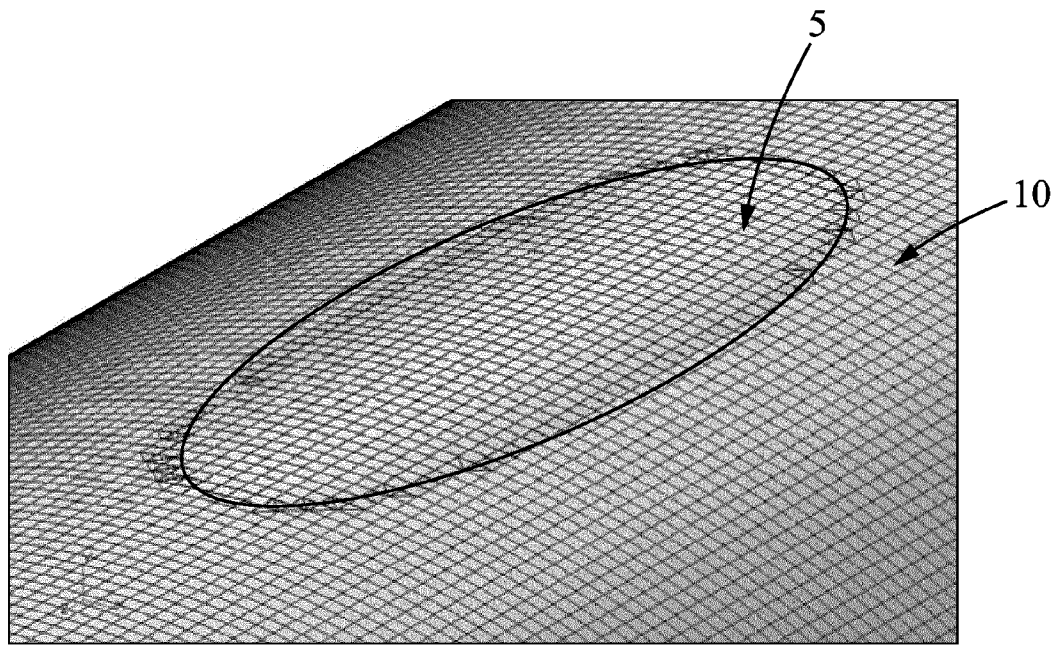
FIGS. 7a and 7b illustrate step d5) in the variant represented in FIG. 6.
Figure 7B:
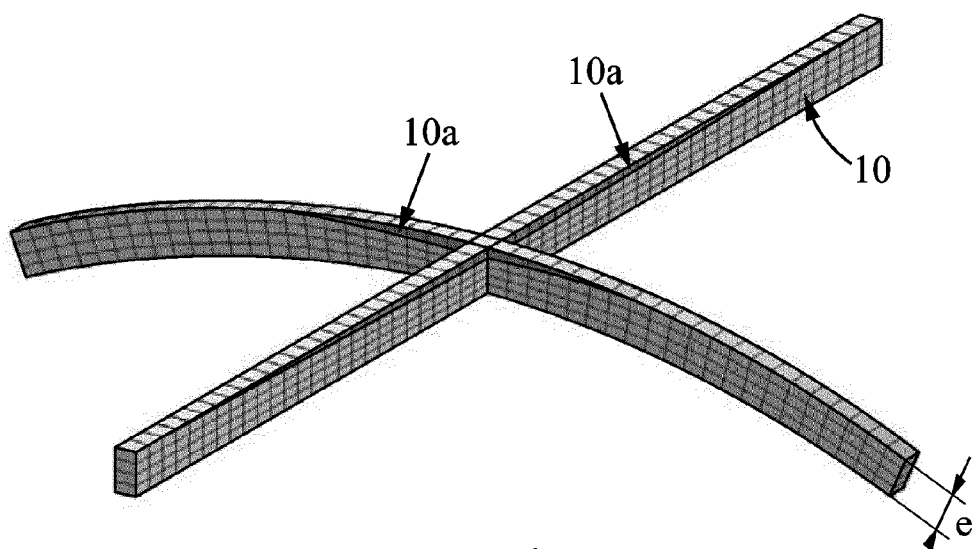

FIGS. 7a and 7b show how the thinning in sub-step d5) can be achieved in practice. FIG. 7b represents some of the finite elements of FIG. 7a, plus those below them, providing a perspective view which shows the number of layers of finite elements in the given area 5. A few finite elements 10a are removed within this area. In the example, a supplemental layer of finite elements was put in at the time of the discretization done in step c). Then this layer is removed in sub-step d5), which thins the deformed test wall. This has the advantage of keeping the same number of layers of finite elements for the entire deformed test wall (four layers in this case).

Figure 8:
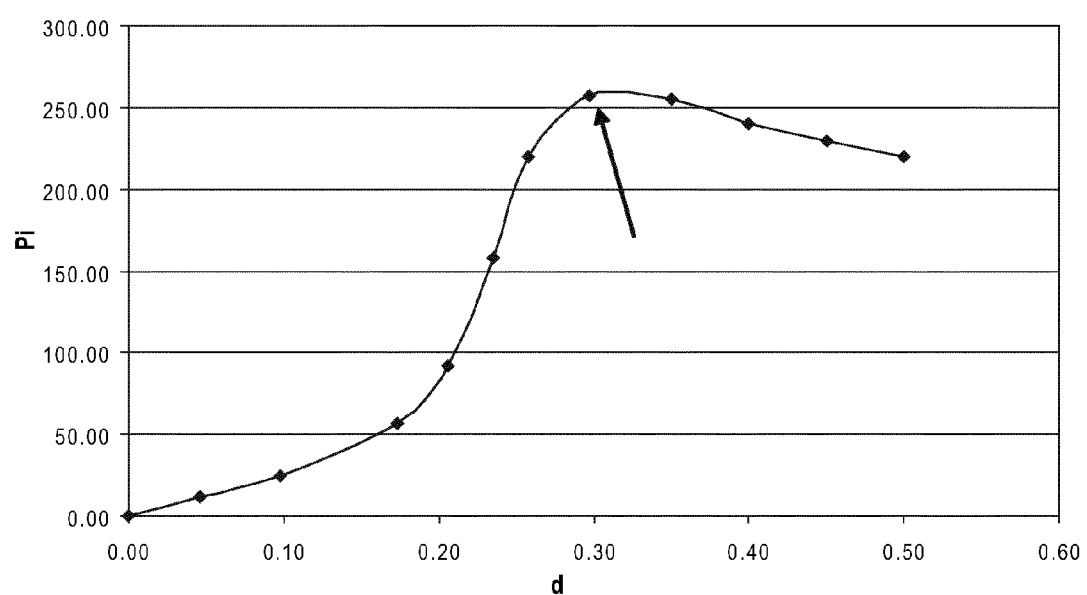
FIG. 8 is a graph illustrating the variation in the diameter of the deformed test wall during the mechanical performance calculation (step e).

FIG. 8 shows the radial deformation of the deformed test wall as a function of the internal pressure during a calculation of burst resistance. The burst pressure is about 260 bars. The pressure and radial deformation progressively increase prior to bursting. The burst occurs at the location indicated by the arrow. Then the pressure drops slightly and the radial deformation increases quickly, which are physical representations of bursting.

The method of the invention has been validated by experimental tests concerning tubes closed off at both ends and having a shape similar to the element 7 in FIG. 3c.

Tubes of three different diameters were used:
610 mm: tubes numbered from 1 to 3, nominal thickness 12.5 mm,
457.2 mm: tubes numbered from 4 to 6, nominal thickness 10.5 mm,
323.9 mm: tubes numbered from 7 to 9, nominal thickness 9.53 mm, Table 1 below summarizes the different tests and specifies the object used to create the damage (referred to as the "impactor"). This is the actual physical equivalent of the test body. It was driven into the tubes using a press, applying loads corresponding to a mass of about 90 tons.

TABLE 1 definition of experimental tests.

| | | Definition of test | |
|---|---|---|---|
| | Impactor | | Type of test |
| 24 inch tube 610 × 12.50 | Tube N1 | 2006 longitudinal | |
| | Tube N3 | 2006 transversal | |
| | Tube N2 | R8 | |
| 18 inch tube 457.2 × 10.0 | Tube N4 | 2006 longitudinal | Machined 4 mm with bevel |
| | Tube N6 | 2006 longitudinal | Machined 4 mm with fillets |
| | Tube N5 | Conical 36 | |
| 12 inch tube 323.9 × 9.53 | Tube N9 | 2006 longitudinal | |
| | Tube N7 | 2006 longitudinal | |
| | Tube N8 | 2006 transversal | Bent tube |

In Table 1, "2006 longitudinal" refers to an object having the same shape as the element 7 in FIG. 3c, but smaller by a factor of about ten. The longitudinal axis of the object was parallel to the longitudinal axis of the tube, and the object and the tube were superimposed then pressed vertically against each other.

"2006 transversal" indicates that the longitudinal axis of the object was orthogonal to the longitudinal axis of the tube, but the object and the tube were still superimposed then pressed vertically against each other.

"Conical 36" means that an object in the shape of a downward-pointing truncated cone was used as the impactor, and was pressed vertically towards the tube.

"R8" is a cylinder having a base which is a deformed isosceles trapezoid in the sense that the smallest side of the trapezoid is replaced by a half-circle extending from the two sides adjacent to the small side. The object R8 was pressed vertically against the tubes, its round portion (half circle) pointing downwards.

During these nine experiments, after the insertion phase in which the damage was created, the method of the invention was applied to the damaged tubes:

characteriing the external surface of the deformed tube by an optical method. The actual dents obtained are specified in Table 2 below.

modeling a test body, modeling the undamaged tube (i. e. the test wall), calculating a deformed test wall.

Table 2 compares the press load that was required to deform the tubes and the load calculated in step d) before the elastic rebound. One can see that the agreement is very good, which confirms that the mechanical models are sufficiently representative and that the test body acts on the test wall in a representative manner.

Note that a large range of values for the relative indentation were investigated, ranging from 56% to the original diameter of the tubes.

TABLE 2 comparison of simulated press loads and damage loads.

| | | Values at end of impacting | | |
|---|---|---|---|---|
| | | Indentation (% of diameter) Impactor | Impacting load (tons) | |
| | | | Digital simulations | Measurements |
| 24 inch tube 610 × 12.50 | Tube N1 | 172 (28%) | 89 | 82 |
| | Tube N3 | 232 (38%) | 82 | 88 |
| | Tube N2 | 315 (52%) | 88 | 85 |
| 18 inch tube 457.2 × 10.0 | Tube N4 | 82 (18%) | 43 | 43 |
| | Tube N6 | 127 (28%) | 55 | 65 |
| | Tube N5 | 238 (52%) | 69* | 65 |
| 12 inch tube 323.9 × 9.53 | Tube N9 | 92 (39.5%) | 51 | 51 |
| | Tube N7 | 184 (56%) | 67 | 76 |
| | Tube N8 | 184 (56%) | 37.5 | 40 |

It was also possible to verify (see Table 3) that the agreement is very good concerning the value of the elastic rebound (phenomenon of the wall rebounding when the "impactor" object is removed) and the form of the damage, particularly the ovalization of the tubes in the area of impact.

TABLE 3 comparison of measured and simulated elastic rebound and ovalization.

| | | Elastic rebound (mm) | | | Ovalization (mm) | | |
|---|---|---|---|---|---|---|---|
| | | Dig. simul. | Measurements | delta | Dig. simul. | Measurements | delta |
| 24 inch tube 610 × 12.50 | Tube N1 | 147 | 136 | 11 | 679 | 660 | 19 |
| | Tube N3 | 209 | 201 | 8 | 726 | 720 | 6 |
| | Tube N2 | 284 | 279 | 5 | 789 | 788 | 1 |
| 18 inch tube 457.2 × 10.0 | Tube N4 | 64 | 64 | 0 | 471 | 473 | -2 |
| | Tube N6 | 112 | 111 | 1 | 491 | 494 | -3 |
| | Tube N5 | 217 | 208 | 9 | 554 | 557 | -3 |
| 12 inch tube 323.9 × 9.53 | Tube N9 | 80 | 79.8 | 0.2 | 357 | 357 | 0 |
| | Tube N7 | 174 | 168 | 6 | 402 | 407 | -5 |
| | Tube N8 | 173 | 181 | -8 | 382 | 391 | -9 |

Next, the deformed tubes were subjected to burst testing by injecting water. The following table compares the measured burst pressure (right column) and the burst pressure obtained by calculation at the end of step e) of the method (left column)

TABLE 4 comparison of measured and calculated burst pressures.

| | | Applied pressure Burst value (bars) | |
|---|---|---|---|
| | | Dig. simul. | Measurements |
| 24 inch tube 610 × 12.50 | Tube N1 | 258 | 249 |
| | Tube N3 | 251 | 244 |
| | Tube N2 | 254 | 242 |
| 18 inch tube 457.2 × 10.0 | Tube N4 | 182 | 142 |
| | Tube N6 | 189 | 196 |
| | Tube N5 | 264 | 264 |
| 12 inch tube 323.9 × 9.53 | Tube N9 | 302 | 325 |
| | Tube N7 | 332 | 333 |
| | Tube N8 | 332 | 335 |

As for the burst pressure, a desirable mechanical performance parameter, again it can be seen that the agreement is quite good.

The results for tubes 4 and 6 are not as good, due to the non-incorporation of the stress concentrations due to the machining. The method of the invention therefore does indeed provide a reliable parameter for mechanical performance and does not require modifying or moving the damaged structure, as the tubes are only subjected to a burst test here for comparison purposes.

The embodiments above are intended to be illustrative and not limiting. Additional embodiments may be within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

The invention claimed is:

1. A method for determining a mechanical performance parameter of a structure comprising a wall, the mechanical performance parameter providing information on resistance of the structure to mechanical stress, wherein damage to the structure has caused the wall to change from an initial shape to a damaged shape, the damaged shape being different from the initial shape in a given area, the method comprising the steps of:
   a) making measurements for geometrically characterizing an external surface of the damaged shape in the given area;
   b) modeling, by a processor, a test body based on the measurements made, wherein the test body has a general shape complementary to the damaged shape with a surface substantially identical to the external surface of the damaged shape in the given area;
   c) modeling, by the processor, a test wall having a portion of a shape substantially identical to the initial shape;
   d) calculating, by the processor, a deformed test wall and a stress state related to the deformation, by simulating a relative displacement of the test body and the test wall, the relative displacement being configured to give the deformed test wall an external surface substantially identical to the external surface of the damaged shape characterized in step a); and
   e) evaluating the mechanical performance parameter of the structure using the deformed test wall obtained in step d) thereby assessing the stress state and extent of the damage caused to the structure.

2. The method of claim 1, wherein the evaluation of step e) comprises calculating deformation of the deformed test wall obtained in step d) under the effect of an increasingly intense mechanical stress, wherein the mechanical performance parameter is an intensity at which a rupture or loss of stiffness of the deformed test wall is detected.

3. The method of claim 2, wherein the increasingly intense mechanical stress results from applying increasing internal pressure on the deformed test wall, wherein the test wall modeled in step c) is supplemented with missing portions in order to close off said test wall, and wherein the mechanical performance parameter is a pressure at which bursting of the deformed test wall due to the applied internal pressure is detected.

4. The method of claim 1, wherein calculating deformation of the test wall in step d) and evaluating mechanical performance of the deformed test wall in step e) comprise applying a finite element method, and wherein modeling the test body and the test wall in steps b) and c) comprises a discretization into finite elements.

5. The method of claim 1, wherein calculating deformation of the test wall in step d) and evaluating mechanical performance of the deformed test wall in step e) use an elasto-plastic deformation model of the test wall.

6. The method of claim 1, wherein, for calculating deformation of the test wall in step d), the surface of the test body substantially identical to the external surface of the damaged shape is non-deformable.

7. The method of claim 1, wherein, for calculating deformation of the test wall in step d), the relative displacement of the test body and the test wall comprises a decrease and then an increase in the distance between the test body and the test wall, to take into account a phenomenon of elastic rebound of the test wall.

8. The method of claim 1, wherein, for calculating deformation of the test wall in step d), the relative displacement of the test body and the test wall occurs in a direction which intercepts the test wall in the given area at an incidence substantially orthogonal to an external surface of the initial shape.

9. The method of claim 1, wherein the measurements made in step a) further comprise measurements of a thickness of the damaged shape at a plurality of locations in the given area, the thickness measurements being used to correct the thickness of the deformed test wall obtained by the calculation of step d), such that the deformed test wall has a thickness substantially identical to the thickness of the damaged shape in said plurality of locations.

10. The method of claim 1, wherein the measurements made in step a) for geometrically characterizing the damaged shape comprise one or more types of measurements from among the group consisting of: laser beam triangulation, manual readings, photogrammetry, and ultrasound probing.

11. A non-transitory computer-readable storage medium having a computer program stored thereon, wherein the computer program comprises one or more sequences of instructions accessible to a processor for determining a mechanical performance parameter of a structure comprising a wall, the mechanical performance paremeter providing information on resistance of the structure to mechanical stress, wherein damage to the structure has caused the wall to change from an initial shape to a damaged shape, the damaged shape being different from the initial shape in a given area,
   wherein said instructions, when run by the processor fed with data comprising measurement results for geometrically characterizing the damaged shape in the given area, cause the processor to carry out steps of:
   modeling a test body based on the measurements made, wherein the test body has a general shape complementary to the damaged shape with a surface substantially identical to the external surface of the damaged shape in the given area;
   modeling a test wall having a portion of a shape substantially identical to the initial shape;

calculating a deformed test wall and a stress state related to the deformation, by simulating a relative displacement of the test body and the test wall, the relative displacement being configured to give the deformed test wall an external surface substantially identical to the external surface of the damaged shape; and evaluating the mechanical performance parameter of the structure using the deformed test wall obtained in the calculation step, thereby assessing the stress state and extent of the damage caused to the structure.

* * * * *